(12) United States Patent
Wang et al.

(10) Patent No.: US 12,356,560 B2
(45) Date of Patent: Jul. 8, 2025

(54) SET AND DISPLAY APPARATUS

(71) Applicants: Beijing BOE Display Technology Co., Ltd., Beijing (CN); BOE TECHNOLOGY GROUP CO., LTD., Beijing (CN)

(72) Inventors: Tengfei Wang, Beijing (CN); Zheng Wang, Beijing (CN); Shixin Geng, Beijing (CN); Hetao Wang, Beijing (CN); Tianyang Han, Beijing (CN)

(73) Assignees: Beijing BOE Display Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 148 days.

(21) Appl. No.: 18/023,352

(22) PCT Filed: Mar. 3, 2022

(86) PCT No.: PCT/CN2022/078931
§ 371 (c)(1),
(2) Date: Feb. 25, 2023

(87) PCT Pub. No.: WO2022/267522
PCT Pub. Date: Dec. 29, 2022

(65) Prior Publication Data
US 2024/0015896 A1    Jan. 11, 2024

(30) Foreign Application Priority Data
Jun. 21, 2021 (CN) .................. 202110685925.4

(51) Int. Cl.
*H05K 5/00* (2025.01)
*H05K 5/02* (2006.01)
*H05K 5/13* (2025.01)

(52) U.S. Cl.
CPC ......... *H05K 5/0018* (2022.08); *H05K 5/0204* (2013.01); *H05K 5/0217* (2013.01); *H05K 5/0278* (2013.01); *H05K 5/13* (2025.01)

(58) Field of Classification Search
CPC ................ G06F 1/1601; G06F 1/1656; G06F 2200/1612; G06F 2200/1639;
(Continued)

(56) References Cited

U.S. PATENT DOCUMENTS

2019/0353840 A1* 11/2019 Wang .................... H01L 23/427
2019/0353950 A1* 11/2019 Jin ....................... G02B 6/0055
(Continued)

FOREIGN PATENT DOCUMENTS

| CN | 101441340 A | 5/2009 |
|---|---|---|
| CN | 101750794 A | 6/2010 |

(Continued)

OTHER PUBLICATIONS

Author unknown, "Bar screen network evidence (image)," Website, May 14, 2021, <https://m.tb.cn/h.4sCpHpo?sm=3bfc63>, last visited Aug. 23, 2023.
(Continued)

*Primary Examiner* — Sagar Shrestha
*Assistant Examiner* — Peter Krim
(74) *Attorney, Agent, or Firm* — HOUTTEMAN LAW LLC

(57) ABSTRACT

Provided are a set and a display apparatus. The set includes a display module, a bezel, a back housing and a system board. The bezel is sleeved over a periphery of the display module. The back housing includes a first shell on a side opposite to a back plate of the display module, and a second shell adjacent to an inner peripheral surface of the bezel. One end of the second shell is connected to an edge of the first shell, and the other end of the second shell is provided (Continued)

with a support portion for supporting an edge of the display module so that a reserved space for accommodating the system board is formed between the display module and the first shell, and the second shell is fixedly connected to the bezel to implement configuration and assembly of the system board, thereby improving the user experience.

17 Claims, 7 Drawing Sheets

(58) Field of Classification Search
CPC .. H05K 5/0018; H05K 5/0008; H05K 5/0204; H05K 5/0217; H05K 5/0278; H04N 5/44; G02F 1/1333
See application file for complete search history.

(56) References Cited

U.S. PATENT DOCUMENTS

| | | | | |
|---|---|---|---|---|
| 2021/0003772 | A1* | 1/2021 | Ohnishi | H04N 5/64 |
| 2021/0048917 | A1* | 2/2021 | Hsieh | H05K 5/0017 |
| 2021/0116958 | A1* | 4/2021 | Ryu | H10K 59/131 |
| 2021/0181868 | A1* | 6/2021 | Guynes | G06F 3/0489 |

FOREIGN PATENT DOCUMENTS

| | | |
|---|---|---|
| CN | 104122681 A | 10/2014 |
| CN | 104503109 A | 4/2015 |
| CN | 204964943 U | 1/2016 |
| CN | 105954929 A | 9/2016 |
| CN | 206023960 U | 3/2017 |
| CN | 206249818 U | 6/2017 |
| CN | 208488624 U | 2/2019 |
| CN | 208739466 U | 4/2019 |
| CN | 212410981 U | 1/2021 |
| CN | 113808494 A | 12/2021 |
| CN | 215735164 U | 2/2022 |
| EP | 3572866 A1 | 11/2019 |
| IN | 106681057 A | 5/2017 |
| JP | 2010175989 A | 8/2010 |

OTHER PUBLICATIONS

European Patent Office, Extended European Search Report, Apr. 19, 2024 for application No. EP22827027.8.

* cited by examiner

SET AND DISPLAY APPARATUS

CROSS-REFERENCE TO RELATED APPLICATION

This application is a National Phase Application filed under 35 U.S.C. 371 as a national stage of PCT/CN2022/078931, filed on Mar. 3, 2022.

TECHNICAL FIELD

The present disclosure relates to the field of display technology, and specifically relates to a set and a display apparatus.

BACKGROUND

The set of display screen (e.g., bar screen) demonstrated at brand shops, on goods shelves or the like in the existing market have the following defect: no system board is equipped in the set, and a user needs to prepare and assemble a system board.

SUMMARY

To solve at least one of the technical problems in the existing art, the present disclosure provides a set and a display apparatus which can implement preparation and assembly of a system board.

To achieve the above object, the present disclosure provides a set, including a display module, a bezel, a back housing and a system board, wherein the bezel is sleeved over a periphery of the display module;

the back housing includes a first shell on a side opposite to a back plate of the display module, and a second shell adjacent to an inner peripheral surface of the bezel, wherein one end of the second shell is connected to an edge of the first shell, and the other end of the second shell is provided with a support portion for supporting an edge of the display module so that a reserved space for accommodating the system board is formed between the display module and the first shell, and the second shell is fixedly connected to the bezel.

Optionally, the support portion includes a first sub-protrusion extending from the other end of the second shell to a direction close to the display module, and a second sub-protrusion extending from one end of the first sub-protrusion close to the display module to a side of the second shell away from the bezel, wherein the second sub-protrusion abuts against an edge of the display module.

Optionally, the set further includes a wireless transmission module; wherein a hollow-out region is provided on the back plate of the display module at a position corresponding to the wireless transmission module of the system board, and the hollow-out region is configured to enable signals sent from or received by the wireless transmission module to pass through the back plate.

Optionally, a cover for covering the hollow-out region is provided on the back plate, and configured to enable signals sent from or received by the wireless transmission module to pass through the back plate.

Optionally, a contour shape and an outer peripheral dimension of the bezel are respectively matched with a contour shape and an outer peripheral dimension of the display module.

Optionally, a limiting portion for covering a non-display region of the display panel is provided on a side of the bezel close to a light-emitting surface of a display panel of the display module.

Optionally, the bezel has a rectangular orthographic projection on a plane where a light-emitting surface of the display module is located, with two opposite longer sides and two opposite shorter sides; and the second shell and the bezel are fixedly connected on one side of each longer side of the bezel through a plurality of first fastening screws, and the plurality of first fastening screws on the one side of each longer side of the bezel are arranged along a direction of the longer side.

Optionally, a distance between two adjacent first fastening screws is greater than or equal to 40 mm and less than or equal to 80 mm.

Optionally, the bezel and the display module are fixedly connected on one side of each longer side of the bezel through a plurality of second fastening screws, and the plurality of second fastening screws on the one side of each longer side of the bezel are arranged along the direction of the longer side; and a same number of second fastening screws as the first fastening screws on a same side are provided on the one side of each longer side of the bezel, and a central connection line of orthographic projections of at least some of the first fastening screws and the second fastening screws on a section of the bezel parallel to the longer side is perpendicular to an extending direction of the longer side.

Optionally, a protrusion protruding relative to the inner surface is provided on an inner surface of the second shell facing away from the bezel, and a threaded hole, penetrating from an end face of the protrusion facing away from the bezel to an outer surface of the second shell opposite to the bezel, is provided in the protrusion and configured for threaded engagement with one of the first fastening screws.

Optionally, a plurality of fixing posts are provided on a side surface of the first shell close to the display module, and the plurality of fixing posts is configured to fix the system board so that a gap is reserved between the system board and an inner surface of the first shell opposite to the display module.

Optionally, a surface of the back plate of the display module opposite to the first shell is provided with a plurality of support posts, and the plurality of support posts abut against an inner surface of the first shell opposite to the display module.

Optionally, a stepped portion is provided on the other end of the second shell away from the first shell in a region opposite to the system board, and the stepped portion is configured to escape an edge of the system board as well as an interface on the system board.

Optionally, the stepped portion includes a first step surface lower than the other end of the second shell away from the first shell, and a second step surface lower than the first step surface, wherein a distance is provided between the first step surface and a surface of the system board opposite to the first shell; and the second step surface is lower than at least one interface on the system board.

Optionally, the first shell is provided with a recess portion recessed from an outer surface of the first shell facing away from the display module toward the display module; and the recess portion is provided with a fixing portion and an interface portion.

Optionally, at least one of a USB interface, a power interface or a memory card interface is correspondingly disposed on the second shell and the bezel.

Optionally, an aspect ratio of a display panel of the display module is greater than 4:1.

Optionally, the display module includes the back plate, a reflective sheet, a light guide plate, at least one functional film layer and a display panel, and a middle frame, the reflective sheet, the light guide plate, the at least one functional film layer and the display panel are located on a side of the back plate away from the first shell, and sequentially arranged in a direction away from the back plate, and the middle frame surrounds the reflective sheet, the light guide plate, the at least one functional film layer and the display panel; wherein a backlight source is provided oppositely on a side of a light incident surface of the light guide plate.

Optionally, the middle frame includes a middle frame body surrounding the reflective sheet, the light guide plate, the at least one functional film layer and the display panel, and a positioning frame body between the display panel and the at least one functional film layer, wherein the positioning frame body is configured to bear the display panel, and a buffer gasket is provided between the positioning frame body and the display panel, and between the positioning frame body and the at least one functional film layer, respectively, and wherein a positioning protrusion is provided at a position of the positioning frame body opposite to the light guide plate, and the positioning protrusion is abutted against the light guide plate to fix the light guide plate.

As another technical solution, an embodiment of the present disclosure further provides a display apparatus, including the set provided in the embodiments of the present disclosure.

The present disclosure has the following beneficial effects:

according to the technical solutions of the set and the display apparatus provided in the embodiments of the present disclosure, the back housing of the set includes a first shell on a side opposite to a back plate of the display module, and a second shell on a side adjacent to an inner peripheral surface of the bezel. An edge of the display module is supported by means of the support portion on the other end of the second shell, so that a reserved space for accommodating the system board is formed between the display module and the first shell, which can implement preparation and assembly of the system board. The case where a user needs to prepare and assemble a system board is avoided.

LIST OF REFERENCE NUMERALS

1—bezel; 11—limiting portion; 121, 122—threaded holes; 2—back housing; 21—first shell; 22—second shell; 221—support portion; 221a—first sub-protrusion; 221b—second sub-protrusion; 222—fixing post; 223—protrusion; 223a—threaded hole; 224—stepped portion; 224a—first step surface; 224b—second step surface; 23—recess portion; 24—fixing portion; 25—interface portion; 241—opening; 3—system board; 4—display module; 40—reflective sheet; 41—middle frame; 41a—middle frame body; 41b—positioning frame body; 411—positioning protrusion; 412—slot; 42—back plate; 421—flange; 422—protruding portion; 422a—threaded hole; 422b—accommodation space; 422c—protrusion; 423—clamping piece; 43—cover; 43a—hollow-out region; 44—support post; 45—protective shell; 451—flat cable; 452—connector; 453—reinforcing rib; 46—display panel; 47—buffer gasket; 48—at least one functional film layer; 49—light guide plate; 491—backlight source; 5—reserved space; 61—external connection hole; 7—first fastening screw; and 8—second fastening screw.

DETAIL DESCRIPTION OF EMBODIMENTS

To better understand the technical solution of the present disclosure for those skilled in the art, the set and the display apparatus of the present disclosure will be described in detail below in conjunction with the accompanying drawings.

Figure 1:
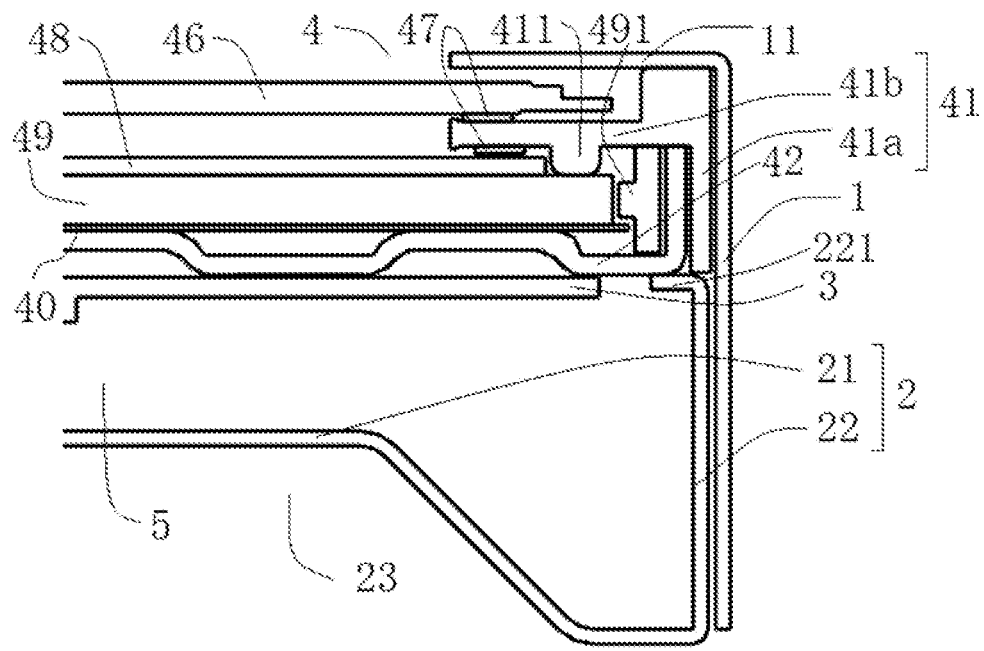
FIG. 1 is a partial sectional view of a set of a display module according to an embodiment of the present disclosure.
Figure 2:
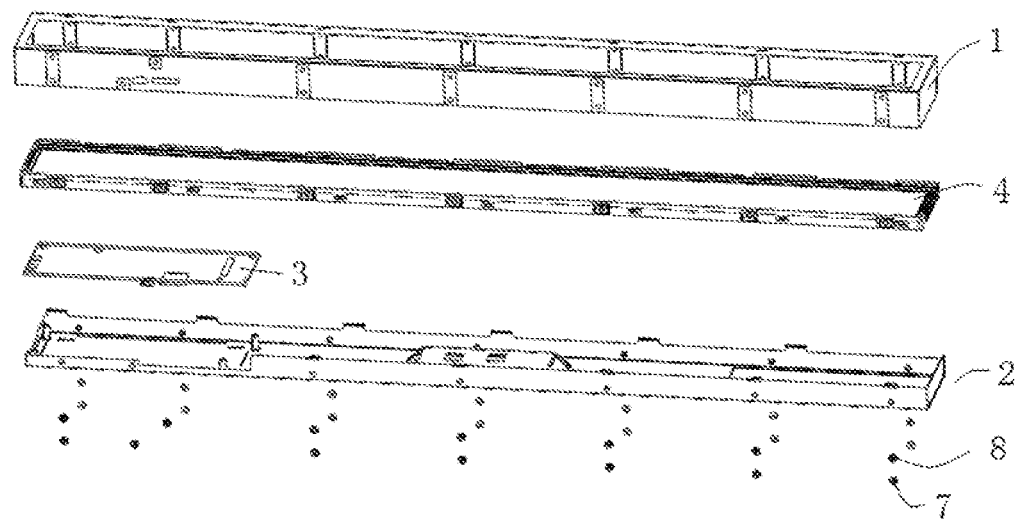
FIG. 2 is an exploded view of a set of a display module according to the embodiment of the present disclosure.

Referring to FIGS. 1 and 2, the set provided in this embodiment includes a display module 4, a bezel 1, a back housing 2 and a system board 3. The display module 4 has a structure as shown in FIG. 1, for example, the display module 4 includes a back plate 42, a reflective sheet 40, a light guide plate 49, at least one functional film layer 48m a display panel 46 and a middle frame 41. The reflective sheet 40, the light guide plate 49, the at least one functional film layer 48m and the display panel 46 are located on a side of the back plate 42 away from the back housing 2, and sequentially arranged in a direction away from the back plate 42. The middle frame 41 surrounds the reflective sheet 40, the light guide plate 49, the at least one functional film layer 48 and the display panel 46. A backlight source 491 is provided oppositely on a side of a light incident surface of the light guide plate 49. The backlight 491 is, for example, a light bar adhered to an inner side of a flange of the back plate 42.

In practical applications, the functional film layer 48 includes, for example, a lower diffusion film and a prism film, and optionally, further includes an upper diffusion film or other functional films.

In some embodiments, optionally, as shown in FIG. 1, the middle frame 41 includes a middle frame body 41a surrounding the reflective sheet 40, the light guide plate 49, the at least one functional film layer 48 and the display panel 46, and a positioning frame body 41b between the display panel 46 and the at least one functional film layer 48. The positioning frame body 41b is configured to bear the display panel 46. A buffer gasket 47 is provided between the positioning frame body 41b and the display panel 46, and between the positioning frame body 41b and the at least one functional film layer 48, respectively, to buffer and thus protect the display panel 46.

In some embodiments, optionally, as shown in FIG. 1, a positioning protrusion 411 is provided at a position of the positioning frame body 41b opposite to the light guide plate 49, and abutted against the light guide plate 49 to fix the light guide plate 49.

In some embodiments, optionally, as shown in FIG. 1, a concave-convex structure is formed on a surface of the back plate 42 to increase the strength of the back plate 42.

The bezel 1 cover is sleeved around the display module 4 to fix and protect the display module 4. Specifically, the bezel 1 has a closed annular shape, and cooperates with the middle frame 41 of the display module 4 by means of, for example, clearance fit, so as to guarantee that display module 4 can be assembled into the bezel 1 smoothly. A clearance between the middle frame 41 of the display module 4 and the bezel 1 is greater than or equal to 0.3 mm, for example.

Figure 3A:
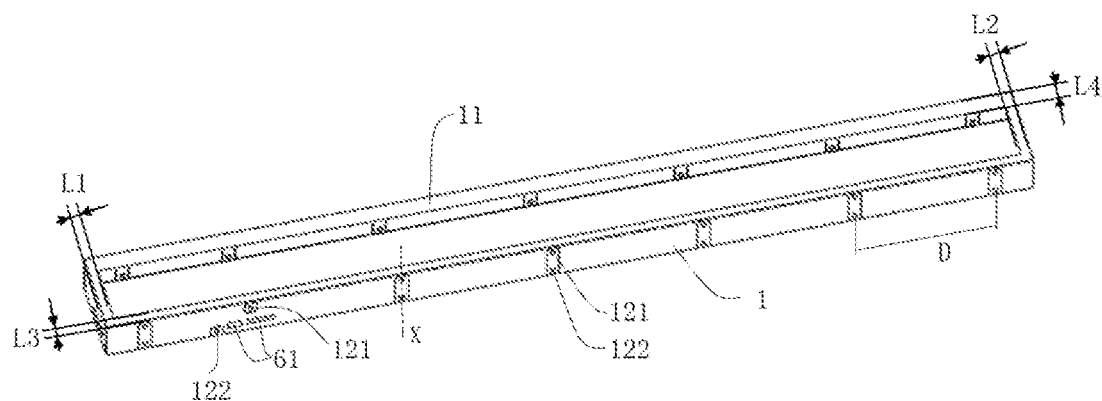
FIG. 3A is a structural diagram of a bezel used in an embodiment of the present disclosure.

In some embodiments, optionally, as shown in FIG. 3A, a contour shape and an outer peripheral dimension (i.e., an outer contour dimension) of the bezel 1 are respectively matched with a contour shape and an outer peripheral dimension (i.e., an outer contour dimension) of the display module 4. It should be noted that the contour shape of the bezel 1 is matched with the contour shape of the display module 4, which means that the two have consistent contour shapes. For example, the display module 4 has a rectangular shape, and the bezel 1 has a rectangular orthographic projection on a plane where a light-emitting surface of the display module 4 is located. The outer peripheral dimension of the bezel 1 is matched with the outer peripheral dimension of the display module 4, which means that the outer peripheral dimensions of the bezel 1 and the display module 4 enable the display module 4 to be accommodated in the bezel 1. On this basis, optionally, the bezel 1 and the middle frame 41 of the display module 4 are, for example, in clearance fit. With the contour shape and the outer peripheral dimension of the bezel 1 respectively matched with the contour shape and the outer peripheral dimension of the display module 4, compactness of the set is improved, a low-profile set and a narrow-bezel display module are facilitated, and meanwhile, the display module 4 is prevented from sliding in the bezel 1, thereby improving stability of the set.

Taking a bar-shaped display module 4 with a display panel 46 of 21 inches as an example, the outer peripheral dimension of the display module 4 (assuming that the display module has the original front frame and rear case) is: 542.4 mm in length; 54.7 mm in width; and 12 mm in thickness. Accordingly, the matched outer peripheral dimension (i.e., the outer contour dimension) of the bezel 1 is: 542.4 mm in length; 54.7 mm in width; and 23.9 mm in thickness. In addition, optionally, an inner peripheral dimension of the bezel 1 is: 530.4 mm in length; 37.4 mm in width; and 0.6 mm in wall thickness. In other words, the bezel 1 replaces the original front frame of the display module 4, and surrounds the display module 4 for protection purposes.

In the existing art, the display module has a front frame. When the set is assembled, the set is provided with a bezel, Therefore, a side surface of the display panel includes two layers of frame, the front frame and the bezel. Therefore, compared with the existing art, the present disclosure can reduce the thickness of the peripheral frame body of the display panel, and improve attractiveness and use experience of the set.

In some embodiments, optionally, as shown in FIG. 3A, a limiting portion 11 for covering a non-display region of the display panel 46 is provided on a side of the bezel 1 close to a light-emitting surface of a display panel 46 of the display module 4. By means of the limiting portion 11, the limiting function on the display module 4 is further enhanced and stability of the set is improved, while dust or other pollutants are further prevented from getting into in the set. The limiting portion 11 and the bezel 1 form an angle of 90°.

The limiting portion 11 may be integrally formed or welded together with the bezel 1.

Taking a bar-shaped display module 4 with a display panel 46 of 21 inches as an example, as shown in FIG. 3A, the limiting portion 11 has a rectangular bezel structure. Of the four bar-shaped sides of the rectangular bezel structure, two shorter bar-shaped sides may each have a width (L1, L2) of 6 mm; one of the longer bar-shaped sides may have a width L3 of 6 mm; and the other of the longer bar-shaped sides may have a width L4 of 11.3 mm. That is, the width of one longer bar-shaped side is designed to be different from the width of the other longer bar-shaped side. Optionally, the longer bar-shaped side with a smaller width is the same or approximately the same in width as the shorter bar-shaped sides. Apparently, in practical applications, these dimensions may be set freely as long as they are adapted to corresponding dimensions of the non-display region of the display module 4.

It should be noted that when the bezel has a rectangular orthographic projection on the plane where the light-emitting surface of the display module is located, the rectangle of the rectangular orthographic projection may include a right-angled rectangle or a rounded rectangle. Alternatively, some vertex positions of the rectangle are set to rounded corners. A right-angled rectangle is a rectangle in the conventional sense, with all sides of the rectangle being line segments.

In some embodiments, optionally, the bezel 1 is made of a metal material, such as a steel plate, and a corrosion resistant layer (e.g., zinc) is covered on an outer surface of the metal material. The corrosion resistant layer is prepared by, for example, electroplating. A total thickness of the metal material and the corrosion resistant layer is, for example, 0.6 mm.

Referring to FIG. 1, the back housing 2 includes a first shell 21 on a side opposite to a back plate 42 of the display module 4, and a second shell 22 adjacent to an inner peripheral surface of the bezel 1. The second shell 22 may be disposed in contact with the bezel 1. Alternatively, a gap may be provided between the second shell 22 and the bezel 1. Further, one end (i.e., the end adjacent to the first shell 21)

of the second shell 22 is connected to an edge of the first shell 21. For example, the second shell 22 may be integrally formed or welded together with the first shell 21. The other end (i.e., the end away from the first shell 21) of the second shell 22 is provided with a support portion 221 for supporting an edge of the display module 4, so that a reserved space 5 for accommodating the system board 3 is formed between the display module 4 and the first shell 21. The second shell 22 is fixedly connected to the bezel 1. Specifically, the support portion 221 may contact an edge of the back plate 42 of the display module 4.

With the support portion 221 supporting the edge of the display module 4, a reserved space 5 for accommodating the system board is formed between the display module 4 and the first shell 21, which can implement preparation and assembly of the system board 3, so as to avoid the case where a user needs to prepare and assemble the system board 3. In addition, the support portion 221 can further improve the structural strength of the back housing 2.

FIG. 1 shows only a schematic structural diagram of the support portion 221. Specific structures of the support portion 221 will be described in detail below. For example, in some embodiments, optionally, as shown in FIG. 6B, the support portion 221 includes a first sub-protrusion 221a protruding from the other end of the second shell 22 (i.e., the end away from the first shell 21). The protruding direction of the first sub-protrusion 221a forms an angle, preferably 90°, with a plane where the light-emitting surface of the display panel 46 of the display module 4 is located. The support portion 221 further includes a second sub-protrusion 221b extending from one end of the first sub-protrusion 221a close to the display module 4 to a side of the second shell 22 away from the bezel 1. The second sub-protrusion 221b abuts against an edge of the display module 4 (e.g., the back plate 42). The first sub-protrusion 221a can increase the reserved space 5, thereby ensuring enough space for accommodating the system board. The second sub-protrusion 221b can increase a contact area between the back housing 2 and the display module 4, thereby further improving the structural stability. Apparently, in practical applications, the first sub-protrusion 221a may be omitted, and only the second sub-protrusion 221b is provided at the other end of the second shell 22.

Figure 6A:
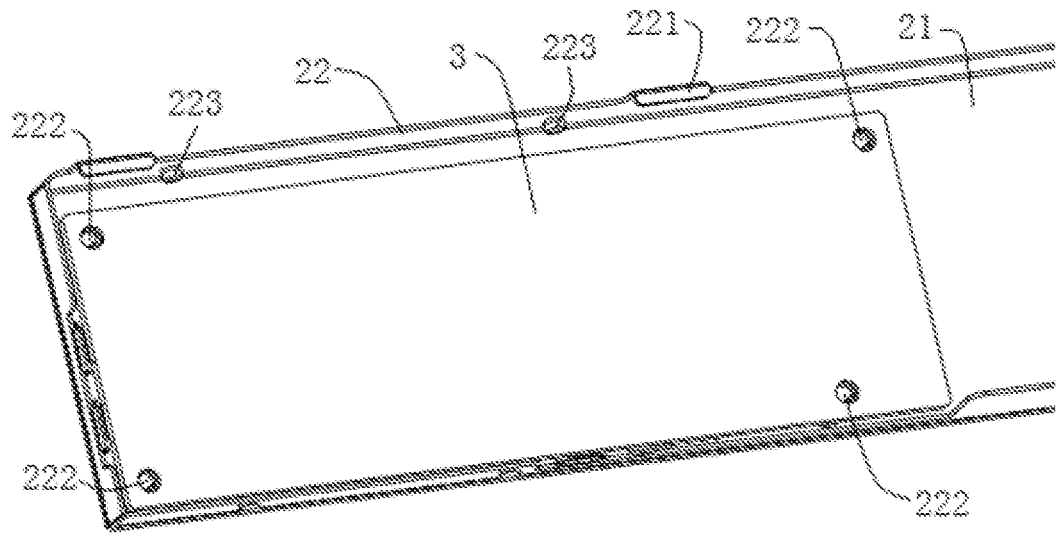
FIG. 6A is a structural diagram of a system board mounted on a back housing used in an embodiment of the present disclosure.
Figure 6B:
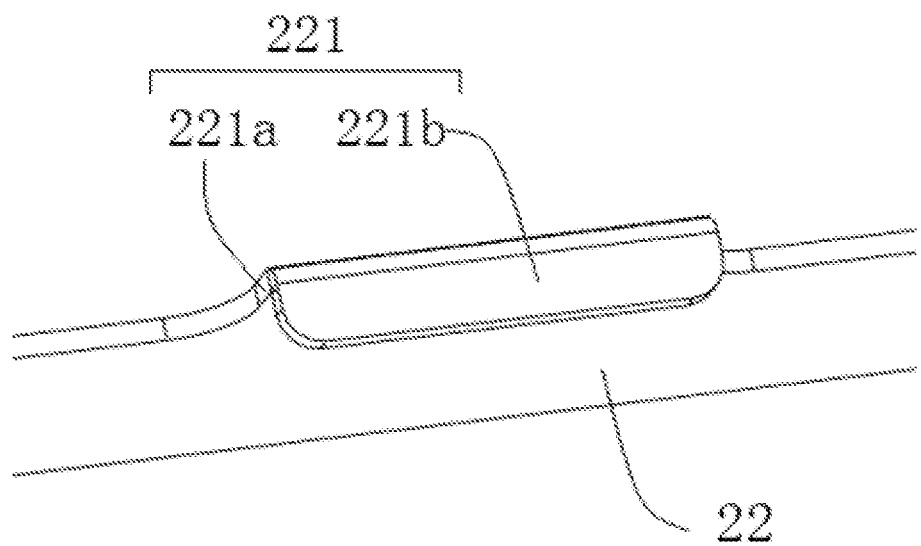
FIG. 6B is a structural diagram of a support portion used in an embodiment of the present disclosure.

In some embodiments, optionally, as shown in FIG. 6A, a plurality of support portions 221 are provided and arranged, for example, at equal intervals, on one side of each longer side of the second shell 22. In this manner, the display module 4 can be uniformly supported, and a uniform and stable supporting force can be ensured.

In some embodiments, optionally, at least one reserved space 5 is provided at a position of 20 mm or more in a direction perpendicular to the system board 3. This dimension range can ensure sufficient space for accommodating the system board 3.

In some embodiments, optionally, the first shell 21 includes, for example, a flat plate structure. The flat plate structure may have an extending direction, for example, parallel to an extending direction of the back plate 42 of the display module 4. The flat plate structure have an orthographic projection on the plane where the light-emitting surface of the display panel 46 is located in a shape matched with an orthographic projection of the back plate 42 of the display module 4 on the plane where the light-emitting surface of the display panel 46 is located. For example, both orthographic projections are rectangular. The second shell 22 has, for example, a closed bezel structure. The bezel structure may form an angle of 90 degrees with the flat plate structure. The extending direction of the back plate 42 may be an extending direction of the plane where the light-emitting surface of the display panel 46 is located.

As shown in FIG. 1, the bezel 1 is sleeved around not only the display module 4 (e.g., the middle frame 41), but also the second shell 22, which is more conducive to improving compactness and connection stability of the set. In some embodiments, optionally, a mounting clearance is provided between the second shell 22 and the bezel 1, to ensure that the second shell 22 and the side bezel 1 can be assembled smoothly, and repeatability of the assembly can be achieved. Optionally, the mounting clearance is greater than or equal to 0.3 mm.

Figure 6C:
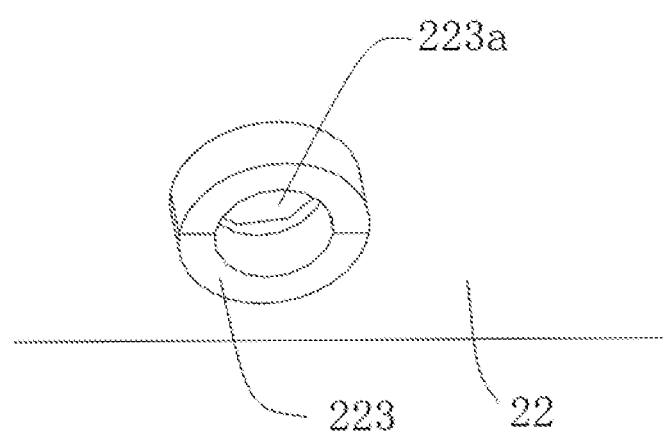
FIG. 6C is a structural diagram of a protrusion used in an embodiment of the present disclosure.

The second shell 22 may be fixedly connected to the bezel 1 in various manners. For example, referring to FIGS. 2, 3A and 3B together, and taking the case where the bezel 1 has a rectangular orthographic projection on the plane where the light-emitting surface of the display module 4 is located as an example, the bezel 1 has two opposite longer sides and two opposite shorter sides. The second shell 22 and the bezel 1 are fixedly connected on one side of each longer side of the bezel 1 through a plurality of first fastening screws 7. The plurality of first fastening screws 7 are arranged along a direction of the longer side. Specifically, as shown in FIG. 3A, a plurality of threaded holes 122 are provided on one side of each longer side of the bezel 1. In some embodiments, optionally, as shown in FIG. 6C, a protrusion 223 protruding relative to the inner surface is provided on an inner surface the second shell 22 facing away from the bezel 1. A threaded hole 223a, penetrating from an end face of the protrusion 223 facing away from the bezel 1 to an outer surface of the second shell 22 opposite to the bezel 1, is provided in the protrusion 223. The threaded holes 223a and the threaded holes 122 are same in the number and arranged coaxially in one-to-one correspondence. Also, a same number of first fastening screws 7 as the threaded holes 122 are provided, and the first fastening screws 7 are threadedly engaged with the threaded holes 122 and the respective threaded holes in the second shell 22, so as to implement fixed connection of the second shell 22 to the bezel 1.

In this embodiment, as shown in FIG. 3A, a same number of second fastening screws 8 as the first fastening screws 7 on a same side are provided on the one side of each longer side of the bezel 1. The first fastening screws 7 and the second fastening screws 8 are arranged in pairs in a direction perpendicular to the extending direction of the longer side. Specifically, for each pair of first fastening screw 7 and second fastening screw 8, a central connection line of orthogonal projections of the first fastening screw 7 and the second fastening screw 8 on a section of the bezel 1 parallel to the longer side is perpendicular to the extending direction of the longer side. In other words, each pair of first fastening screw 7 and second fastening screw 8 is arranged along the direction X in FIG. 3A.

Meanwhile, the first fastening screws 7 arranged along the direction of the longer side can ensure a uniform load on the bezel 1 and the second shell 22, so that the bezel 1 and the second shell 22 are not easy to be deformed, and bearing capacity of the fastening screws can be improved. This effect is more obvious especially for a bar-shaped display module 4 with a greater aspect ratio. Meanwhile, for a bar-shaped display module 4 with a greater aspect ratio, optionally, the second shell 22 and the one side of each shorter side of the bezel 1 may be provided without the first fastening screws 7 and corresponding threaded holes. By only providing the first fastening screws 7 at intervals on each longer side, the strength of each shorter side can be ensured, the defects including light leakage, deformation and the like can be effectively prevented, and in addition, sufficient space can be reserved for arrangement of an external connection hole 61, such as an interface.

In some embodiments, optionally, as shown in FIG. 3A, a distance between two adjacent first fastening screws 7. That is, a distance D between two adjacent threaded holes 122, is greater than or equal to 40 mm and less than or equal to 80 mm. By setting the distance D within this range, it can ensure a uniform load on the bezel 1 and the second shell 22, so that the bezel 1 and the second shell 22 are not easy to be deformed, and bearing capacity of the fastening screws can be can improved. Taking a bar-shaped display module 4 with a display panel 46 of 21 inches as an example, each first fastening screw 7 is, for example, a screw of M2.0×2.1 (specification×pitch), seven threaded holes 122 are provided on one side of each longer side of the bezel 1, and the distance D between two adjacent threaded holes 122 is, for example, in the range of [60 mm, 65 mm].

It should be noted that, as shown in FIG. 3A, if a position of an external connection hole 61, such as an interface, on a longer side of the bezel 1 conflicts with a position of a threaded hole 122, the position of the threaded hole 122 can be appropriately offset. The offset should ensure that the distance between this threaded hole 122 and another adjacent threaded hole 122 is maintained within the range of being greater than or equal to 40 mm and less than or equal to 80 mm.

Figure 3B:
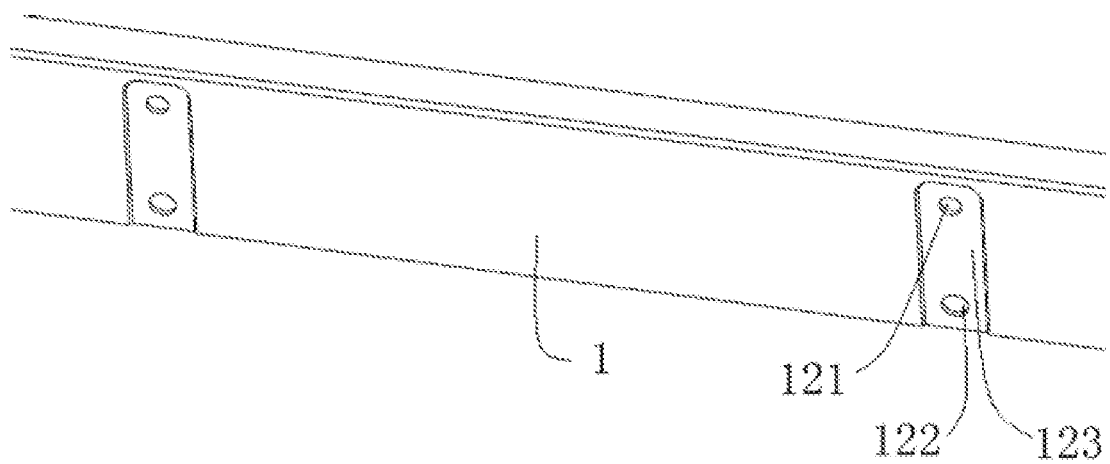
FIG. 3B is a partial structural diagram of one side of a bezel used in an embodiment of the present disclosure.

In some embodiments, optionally, referring to FIGS. 2, 3A and 3B together, the bezel 1 and the display module 4 are fixedly connected on one side of each longer side of the bezel 1 through a plurality of second fastening screws 8. The plurality of second fastening screws 8 are arranged along a direction of the longer side at intervals. In this manner, the bezel 1 is fixedly connected to both the second shell 22 and the display module 4 (e.g., the middle frame 41), which can guarantee stability of the display module 4 and further improve stability of the set. Specifically, as shown in FIG. 3A, a plurality of threaded holes 121 are provided on one side of each longer side of the bezel 1, and correspondingly, threaded holes (not shown) are provided in the display module 4 (e.g., the middle frame 41). A number of the threaded holes 121 is the same as that of the second fastening screws 8, and the second fastening screws 8 are threadedly engaged with the threaded holes 121 and the corresponding threaded holes in the display module 4 (e.g., the middle frame 41) in one-to-one correspondence, so as to implement fixed connection of the display module 4 (e.g., the middle frame 41) and the bezel 1.

In some embodiments, optionally, as shown in FIG. 3A, a same number of second fastening screws 8 as the first fastening screws 7 on a same side are provided on the one side of each longer side of the bezel 1. In other words, the threaded holes 121 and the threaded holes 122 on the one side of each longer side of the bezel 1 are same in the number, and arranged in one-to-one correspondence along a direction perpendicular to the longer side of the bezel 1. In this manner, it can ensure a uniform load on the bezel 1, the display module 4 (e.g., the middle frame 41), and the second shell 22, so that the bezel 1 and the second shell 22 are not easy to be deformed, and with the plurality of first fastening screws and the plurality of second fastening screws both arranged in the extending direction of the longer side of the bezel 1, a bearing capacity of the fastening screws can be improved.

In some embodiments, optionally, as shown in FIG. 3B, a counterbore 123 is further provided on one side of each longer side of the bezel 1 in a region where each threaded hole 121 and a corresponding threaded hole 122 are located. The counterbore 123 may accommodate screw heads of a first fastening screw 7 and a second fastening screw 8, to prevent the screw heads from protruding relative to an outer peripheral surface of the bezel 1.

Figure 3C:
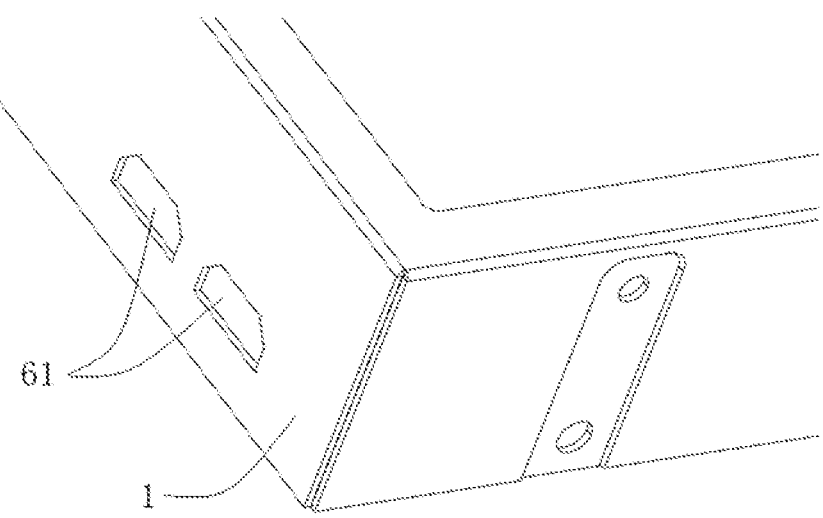
FIG. 3C is a partial structural diagram of one corner of a bezel used in an embodiment of the present disclosure.

In some embodiments, optionally, as shown in FIGS. 3A and 3C, external connection holes 61 are correspondingly provided on the second shell 22 and the bezel 1. The external connection holes 61 may include at least one of a USB interface, a power interface or a memory card interface, Alternatively, the external connection holes 61 may be set according to a requirement of a user. It should be noted that positions of the external connection holes 61 on the second shell 22 and the bezel 1 can be set freely according to specific requirements.

Figure 8A:
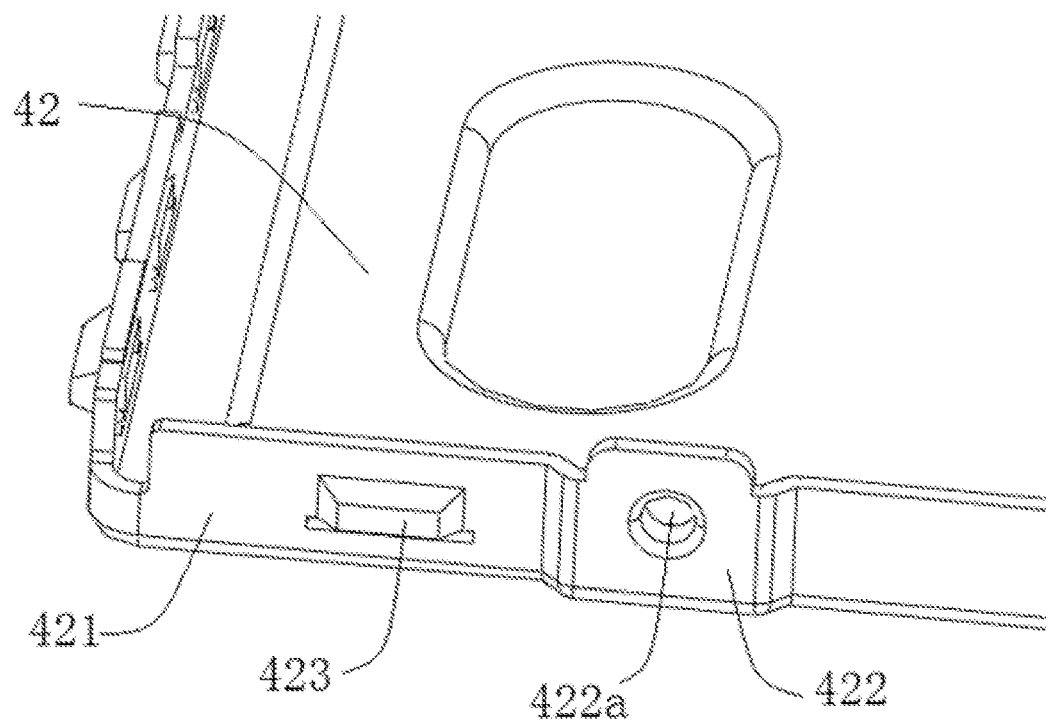
FIG. 8A is a partial structural diagram of a back plate of a display module used in an embodiment of the present disclosure.
Figure 8B:
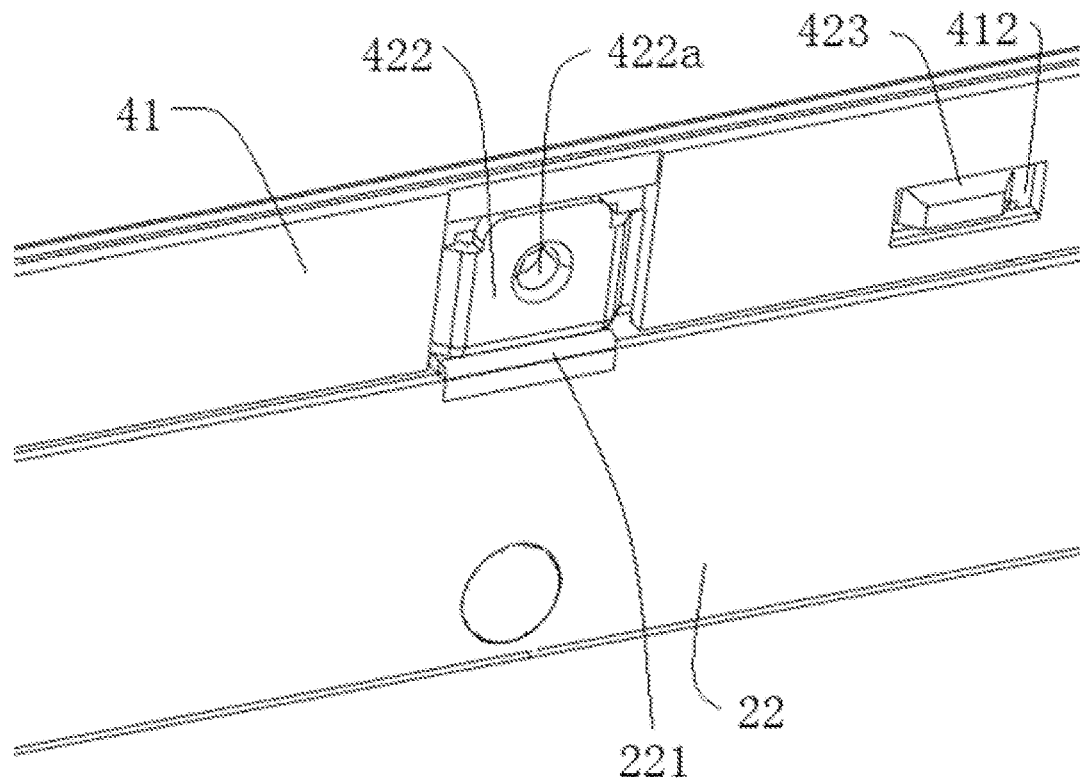
FIG. 8B is a partial structural diagram illustrating connection between a back plate and a middle frame of a display module used in an embodiment of the present disclosure.

In some embodiments, optionally, as shown in FIGS. 8A and 8B, a flange 421 is provided around an edge of the back plate 42, The flange 421 is provided relatively on an inner side of the middle frame body 41a of the middle frame 41. A protruding portion 422, which protrudes relative to an outer peripheral surface of the flange 421, is provided at each longer side of the flange 421 (opposite to each longer side of the middle frame body 41a). Further, as shown in FIG. 8B, an opening is provided at a position of the middle frame body 41a corresponding to the protruding portion 422, so as to escape the protruding portion 422, that is, to expose the protruding portion 422 from the opening. The protruding portion 422 may serve as a reinforcing rib for enhancing the strength of the flange 421, while being fixedly connected to the bezel 1.

Figure 8C:
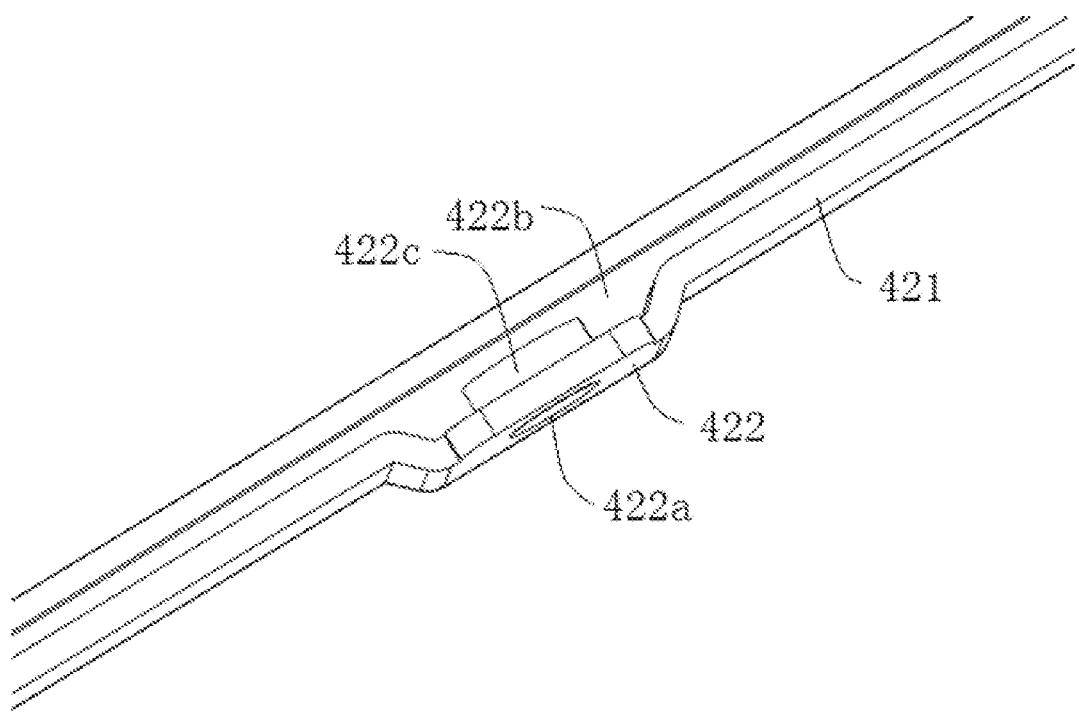
FIG. 8C is a partial structural diagram of a flange of a back plate of a display module used in an embodiment of the present disclosure.

Specifically, as shown in FIG. 8C, an accommodation space 422b is formed between the protruding portion 422 and an element (e.g., the reflective sheet 40, the light guide plate 49, or the at least one functional film layer 48) located inside the protruding portion 422. A protrusion 422c is provided in the accommodation space 422b and at an inner side of the protruding portion 422 at the flange 421. A threaded hole 422a, which penetrates from an end face of the protrusion 422c facing away from the outer peripheral surface of the flange 421 to an outer surface of the protruding portion 422, is provided in the protrusion 422c. The threaded holes 422a and the threaded holes 121 are same in the number and arranged coaxially in one-to-one correspondence. Moreover, the second fastening screws 8 are threadedly engaged with the threaded holes 121 in the bezel 1 and corresponding threaded holes 422a in the protruding portion 422, so as to implement fixed connection of the display module 4 and the bezel 1. Apparently, in practical applications, the bezel 1 may be directly and fixedly connected to the middle frame 41, or fixedly connected to both the middle frame 41 and the flange of the back plate 42.

In some embodiments, optionally, as shown in FIG. 8B, the support portion 221 of the second shell 22 may be disposed at a position corresponding to the protruding portion 422, for example, directly under the protruding portion 422, to support the protruding portion 422.

In some embodiments, optionally, as shown in FIGS. 8A and 8B, a plurality of clamping pieces 423 are provided on each longer side and each shorter side of the flange 421, and a plurality of slots 412 are correspondingly provided on each longer side and each shorter side of the middle frame 41. The clamping pieces 423 and the slots 412 are clamped in one-to-one correspondence to clamp the flange 421 with the middle frame 41.

Figure 4:
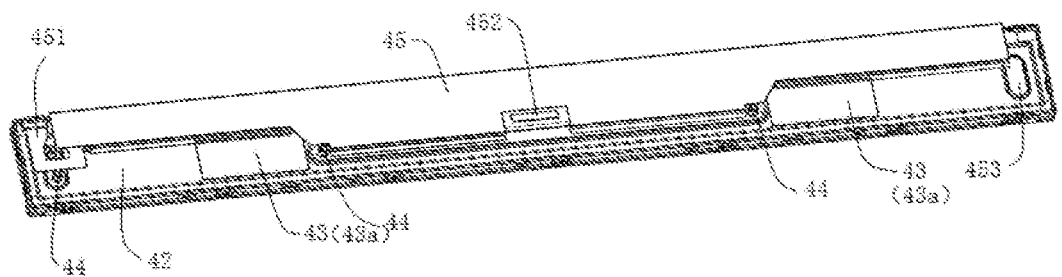
FIG. 4 is a structural diagram of a display module according to an embodiment of the present disclosure.

Referring to FIG. 4, a circuit board (not shown) is provided on the back plate 42 of the display module 4 on a side away from the display panel 46. The circuit board is configured to control the display panel. The circuit board is covered with a protective shell 45 for protecting the circuit board and shielding the circuit board from transmitting an interfering electrical signal to the outside. In practical applications, the protective shell 45 may be omitted due to presence of the back housing 2. It should be noted that the protective shell 45 may cover only a region where the circuit board is located. In some embodiments, other regions of the back plate 42 than the circuit board are not covered by the protective shell 45.

In some embodiments, optionally, as shown in FIG. 4, the circuit board has a flat cable 451 (e.g., a 44FFC cable) connected to the display panel 46. The circuit board can illuminate the backlight 491 through the flat cable 451. The circuit board further has a connector 452 that is connected to the system board 3, so as to receive a display signal transmitted from the system board 3.

Moreover, the set of this embodiment further includes a wireless transmission module (not shown), which may be integrated on the system board 3, or may be independently provided. As shown in FIG. 4, a hollow-out region 43*a* is provided on the back plate 42 of the display module 4. At least one hollow-out region 43*a* may be provided. Optionally, a cover 43 for covering the hollow-out region 43*a* is provided on the back plate 42, to prevent impurities such as dusts from entering the display module 4. The hollow-out region 43*a* is located at a position corresponding to the wireless transmission module, so that the back plate 42 will not shield signals, and signals sent from or received by the wireless transmission module can pass through the back plate 42. The wireless transmission module of the system board 3 is configured for communication with a wireless communication device to realize data transmission. For example, a user may use the wireless communication device to communicate with the wireless communication device to load, update, or perform operation on the display content.

It should be noted that the fact that the position of the hollow-out region 43*a* corresponding to the wireless transmission module may refer to that on a plane where a light-emitting surface of the display module 4 is located, an orthographic projection of the hollow-out region completely covers an orthographic projection of the wireless transmission module. Alternatively, the position of the hollow-out region 43*a* is located at the position corresponding to the wireless transmission module may refer to that on a plane where a light-emitting surface of the display module 4 is located, an orthographic projection of the hollow-out region completely overlaps an orthographic projection of the wireless transmission module.

In some cases, the hollow-out region 43*a* may not correspond to the wireless transmission module, as long as the hollow-out region 43*a* is provided on the back plate 42 and the wireless transmission module can communicate with the outside.

By providing the hollow-out region 43*a* on the back plate 42 of the display module 4 at a position corresponding to the wireless transmission module, to enable signals sent from or received by the wireless transmission module to pass through the back plate, the back plate 42 will not shield signals, and a user can use a wireless communication device and the wireless transmission module for loading and updating of the display content, thereby facilitating loading and updating of the display content, and improving the user experience.

The cover 43 is configured to enable signals sent from or received by the wireless transmission module to pass through the back plate 42. The cover 43 is made of an insulating material, for example, a PET polyester film (also called MYLAR sheet).

In some embodiments, optionally, as shown in FIG. 6A, a plurality of fixing posts 222 are provided on a side surface of the first shell 21 close to the display module 4, so as to fix the system board 3. Optionally, under the support of the fixing posts 222, a gap is reserved between the system board 3 and a side surface of the first shell 21 adjacent to the display module 4, so that contact short circuit of devices on the system board 3 can be prevented, and a heat dissipation capacity of the system board 3 can be enhanced. Specifically, the fixing posts 222 may be connected to the system board 3 in various manners. For example, mounting holes may be provided near four corners of the system board 3, so that the system board can be fixedly connected to the fixing posts 222 via fastening screws (not shown).

In some embodiments, optionally, as shown in FIG. 4, a surface of the back plate 42 of the display module 4 opposite to the first shell 21 is provided with a plurality of support posts 44. The plurality of support posts 44 are staggered from the system board 3, so as to avoid interference during assembly of the set. For example, the plurality of support posts 44 may be distributed in a peripheral region of the system board 3. Further, the support posts 44 may be provided in any other region than a region corresponding to the system board 3. Moreover, the support posts 44 abut against a side surface of the first shell 21 adjacent to the display module 4 to support the first shell 21. By means of the support posts 44, stability of the set can be further improved.

In some embodiments, optionally, as shown in FIG. 4, a reinforcing rib 453 is provided on the back plate 42 of the display module 4 on a side away from the display panel 46, so as to enhance the strength of the back plate 42. In addition, the reinforcing rib 453 may be further configured to reserve positions for the support posts 44.

Figure 5:
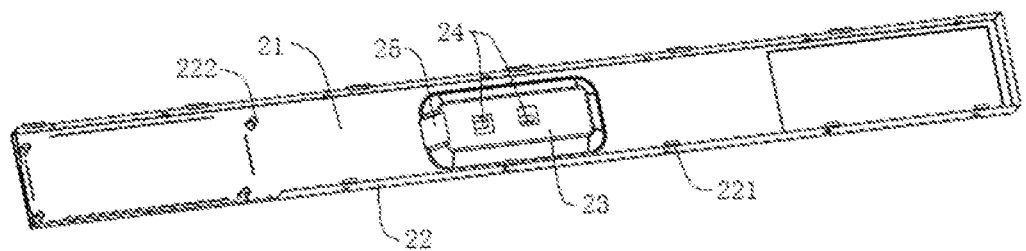
FIG. 5 is a structural diagram of a back housing used in an embodiment of the present disclosure.
Figure 6D:
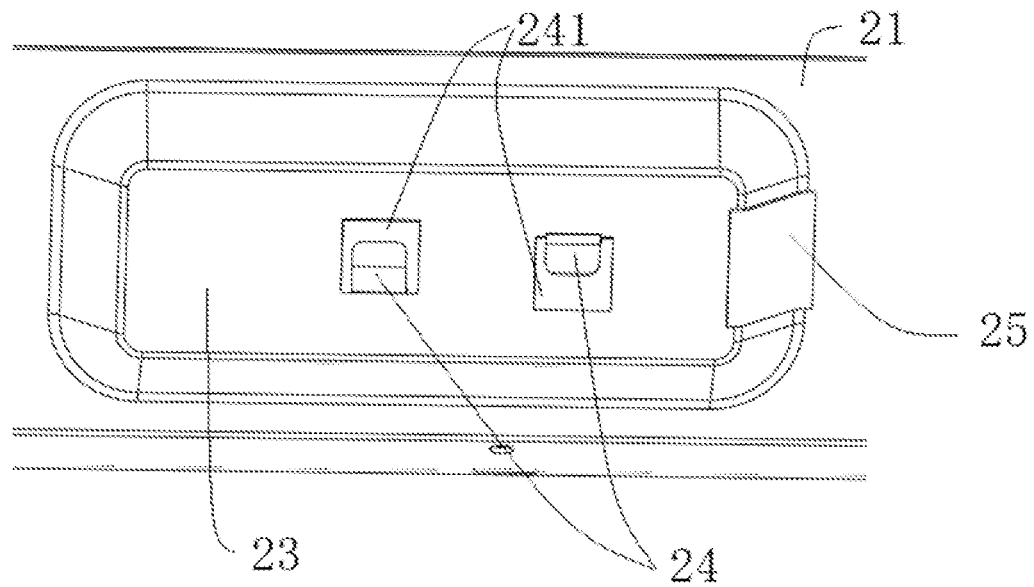
FIG. 6D is a structural diagram of a recess portion used in an embodiment of the present disclosure.

In some embodiments, optionally, as shown in FIGS. 5 and 6D, the first shell 21 is provided with a recess portion 23 recessed from an outer surface of the first shell 21 facing away from the display module 4 toward the display module 4. The recess portion 23 forms a groove structure on a side of the first shell 21 facing away from the display module 4, to accommodate a wire. For example, the wire can be such as a wire of a power supply, a wire of a wireless transmission module, or the like. Further, a fixing portion 24 for winding and fixing the wire is provided on the recess portion 23. The fixing portion 24 is, for example, two bent hook portions formed on the first shell 21. The two portions are spaced apart from each other and bent in opposite directions, so as to facilitate winding of the wire. Moreover, each of the hook portions is a metal block cut out from the body of the first shell 21. After the cut-out, an opening 241, which can also be passed through by the wire, is correspondingly formed in the first shell 21. Additionally, and optionally, the recess portion 23 may be further provided with an interface portion 25, which may be at least one of a power interface or a signal input interface, for example. Further, the recess portion 23 can enhance a bearing strength of the first shell 21, and improve the reliability of the display apparatus.

Figure 7:
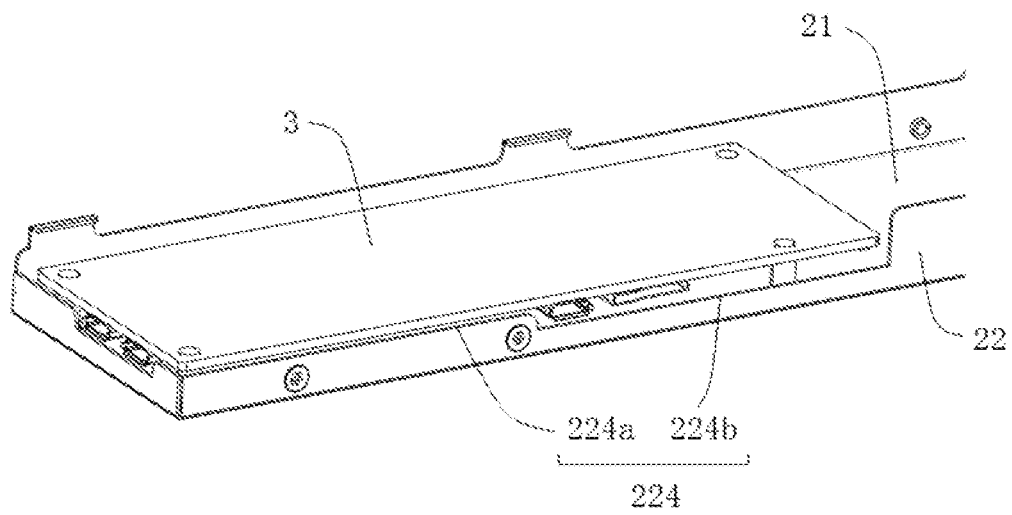
FIG. 7 is a partial structural diagram of a second shell used in an embodiment of the present disclosure.

In some embodiments, optionally, as shown in FIG. 7, a stepped portion 224 is provided on the other end of the second shell 22 away from the first shell 21 in a region opposite to the system board 3. The stepped portion 224 is configured to escape an edge of the system board 3 as well as an interface on the system board 3. In other words, the second shell 22 is not enclosed around the system board 3 in the region of the stepped portion 224, so that contact short circuit between the system board 3 and the second shell 22 is prevented. The structure of the stepped portion 224 may be designed according to a size and an interface position of the system board 3. For example, as shown in FIG. 7, the stepped portion 224 includes a first step surface 224a lower than the other end of the second shell 22 away from the first shell 21, and a second step surface 224b lower than the first step surface 224a. A distance is provided between the first step surface 224a and a surface of the system board 3 opposite to the first shell 21, that is, between the first step surface 224a and the system board 3 in the vertical direction in FIG. 7, so as to avoid short circuit between the first step surface 224a and the system board 3. The distance is, for example, 0.8 mm. The second step surface 224b is lower than at least one interface on the system board 3, so as to expose the at least one interface.

It should be noted that, in practical applications, one or more second step surfaces 224b may be provided, and the specific number and size of the second step surfaces 224b may be set freely according to the interface position and the number of interfaces on the system board 3.

It should be further noted that an edge of the system board 3 may partially overlap a portion between end faces of the first step surface 224a and the second step surface 224b away from the first shell 21. For example, the second shell 22 has a thickness of 0.6 mm, and the region where the edge of the system board 3 overlap the end faces of the first step surface 224a and the second step surface 224b away from the first shell 21 has a dimension of 0.2 mm in the thickness direction of the second shell 22.

In some embodiments, the display panel 46 of the display module 4 is a bar-shaped display panel. For example, a display region of the display panel has an aspect ratio greater than or equal to 4:1. In some embodiments, the display region has an aspect ratio greater than or equal to 10:1, for example, greater than or equal to 20:1, so as to satisfy the requirements for shelf information display.

In practical applications, a size of the display panel 46 of the display module 4 may include, but is not limited to: 19 inches, 21 inches, 23 inches, 24 inches, 28 inches, 29 inches, 36 inches, 37 inches, 43 inches or 46.1 inches. It should be noted that the above sizes of the display panel 46 all refer to diagonal lengths of the display region of the display panel.

In summary, according to the technical solutions of the set and the display apparatus provided in the embodiments of the present disclosure, the back housing of the set includes a first shell on a side opposite to a back plate of the display module, and a second shell on a side adjacent to an inner peripheral surface of the bezel, where by means of the support portion on the other end of the second shell, an edge of the display module is supported so that a reserved space for accommodating the system board is formed between the display module and the first shell, which can implement preparation and assembly of the system board and avoid the case where a user needs to prepare and assemble the system board.

As another technical solution, an embodiment of the present disclosure further provides a display apparatus, including the set provided in the embodiments of the present disclosure.

The display apparatus provided in the embodiment of the present disclosure can, by adopting the set provided in the embodiments of the present disclosure, implement preparation and assembly of the system board, and avoid the case where a user needs to prepare and assemble the system board.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A set, wherein the set comprises a display module, a bezel, a back housing and a system board, wherein the bezel is sleeved over a periphery of the display module;
   the back housing comprises a first shell on a side opposite to a back plate of the display module, and a second shell adjacent to an inner peripheral surface of the bezel,
   wherein one end of the second shell is connected to an edge of the first shell, and the other end of the second shell is provided with a support portion for supporting an edge of the display module, so that a reserved space for accommodating the system board is formed between the display module and the first shell, and the second shell is fixedly connected to the bezel,
   wherein the bezel has a rectangular orthographic projection on a plane where a light-emitting surface of the display module is located, with two opposite longer sides and two opposite shorter sides,
   the second shell and the bezel are fixedly connected on one side of each longer side of the bezel through a plurality of first fastening screws, and the plurality of first fastening screws on the one side of each longer side of the bezel are arranged along a direction of the longer side,
   wherein the bezel and the display module are fixedly connected on one side of each longer side of the bezel through a plurality of second fastening screws, and the plurality of second fastening screws on the one side of each longer side of the bezel are arranged along the direction of the longer side,
   wherein a same number of second fastening screws as the first fastening screws on a same side are provided on the one side of each longer side of the bezel, and a central connection line of orthographic projections of at least some of the first fastening screws and the second fastening screws on a section of the bezel parallel to the longer side is perpendicular to an extending direction of the longer side,
   wherein a protrusion protruding relative to the inner surface is provided on an inner surface of the second shell facing away from the bezel, and
   wherein a threaded hole, penetrating from an end face of the protrusion facing away from the bezel to an outer surface of the second shell opposite to the bezel, is provided in the protrusion and configured for threaded engagement with one of the first fastening screws.

2. The set according to claim 1, wherein the support portion comprises a first sub-protrusion extending from the other end of the second shell to a direction close to the display module, and a second sub-protrusion extending from one end of the first sub-protrusion close to the display module to a side of the second shell away from the bezel, wherein the second sub-protrusion abuts against an edge of the display module.

3. The set according to claim 1, wherein the set further comprises a wireless transmission module; wherein
   a hollow-out region is provided on the back plate of the display module at a position corresponding to the wireless transmission module, and the hollow-out region is configured to enable signals sent from or received by the wireless transmission module to pass through the back plate.

4. The set according to claim 3, wherein a cover for covering the hollow-out region is provided on the back plate.

5. The set according to claim 1, wherein a contour shape and an outer peripheral dimension of the bezel are respectively matched with a contour shape and an outer peripheral dimension of the display module.

6. The set according to claim 1, wherein a limiting portion for covering a non-display region of a display panel is provided on a side of the bezel close to a light-emitting surface of the display panel of the display module.

7. The set according to claim 1, wherein a distance between two adjacent first fastening screws is greater than or equal to 40 mm and less than or equal to 80 mm.

8. The set according to claim 1, wherein a plurality of fixing posts are provided on a side surface of the first shell close to the display module, and the plurality of fixing posts is configured to fix the system board so that a gap is reserved between the system board and an inner surface of the first shell opposite to the display module.

9. The set according to claim 1, wherein a surface of the back plate of the display module opposite to the first shell is provided with a plurality of support posts, and the plurality of support posts abut against an inner surface of the first shell opposite to the display module.

10. The set according to claim 1, wherein a stepped portion is provided on the other end of the second shell away from the first shell in a region opposite to the system board, and the stepped portion is configured to escape an edge of the system board as well as an interface on the system board.

11. The set according to claim 10, wherein the stepped portion comprises a first step surface lower than the other end of the second shell away from the first shell, and a second step surface lower than the first step surface,
wherein a distance is provided between the first step surface and a surface of the system board opposite to the first shell; and
the second step surface is lower than at least one interface on the system board.

12. The set according to claim 1, wherein the first shell is provided with a recess portion recessed from an outer surface of the first shell facing away from the display module toward the display module; and
the recess portion is provided with a fixing portion and an interface portion.

13. The set according to claim 1, wherein at least one of a USB interface, a power interface or a memory card interface is correspondingly disposed on the second shell and the bezel.

14. The set according to claim 1, wherein an aspect ratio of a display region of a display panel of the display module is greater than or equal to 4:1.

15. The set according to claim 1, wherein the display module comprises the back plate, a reflective sheet, a light guide plate, at least one functional film layer, a display panel, and a middle frame,
the reflective sheet, the light guide plate, the at least one functional film layer and the display panel are located on a side of the back plate away from the first shell, and sequentially arranged in a direction away from the back plate, and
the middle frame surrounds the reflective sheet, the light guide plate, the at least one functional film layer and the display panel;
wherein a backlight source is provided oppositely on a side of a light incident surface of the light guide plate.

16. The set according to claim 15, wherein the middle frame comprises a middle frame body surrounding the reflective sheet, the light guide plate, the at least one functional film layer and the display panel, and a positioning frame body between the display panel and the at least one functional film layer,
wherein the positioning frame body is configured to bear the display panel, and
a buffer gasket is provided between the positioning frame body and the display panel, and between the positioning frame body and the at least one functional film layer, respectively, and
wherein a positioning protrusion is provided at a position of the positioning frame body opposite to the light guide plate, and the positioning protrusion is abutted against the light guide plate to fix the light guide plate.

17. A display apparatus, comprising the set according to claim 1.

* * * * *